US012484353B2

(12) United States Patent
West et al.

(10) Patent No.: US 12,484,353 B2
(45) Date of Patent: Nov. 25, 2025

(54) LOW LOSS DIELECTRIC METASURFACE SIDE MIRRORS FOR MICRO-LEDs

(71) Applicant: Intel Corporation, Santa Clara, CA (US)

(72) Inventors: Paul West, Portland, OR (US); Khaled Ahmed, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 825 days.

(21) Appl. No.: 17/561,479

(22) Filed: Dec. 23, 2021

(65) Prior Publication Data

US 2022/0123185 A1 Apr. 21, 2022

(51) Int. Cl.
*H10H 20/856* (2025.01)
*G02B 1/00* (2006.01)
*H10H 20/83* (2025.01)
*H10H 20/84* (2025.01)
*H10H 20/852* (2025.01)
*H10H 29/14* (2025.01)
*H10H 20/01* (2025.01)

(52) U.S. Cl.
CPC .......... *H10H 20/856* (2025.01); *G02B 1/002* (2013.01); *H10H 20/83* (2025.01); *H10H 20/84* (2025.01); *H10H 20/852* (2025.01); *H10H 29/142* (2025.01); *H10H 20/032* (2025.01); *H10H 20/034* (2025.01); *H10H 20/0362* (2025.01); *H10H 20/0363* (2025.01)

(58) Field of Classification Search
None
See application file for complete search history.

(56) References Cited

U.S. PATENT DOCUMENTS

| 2015/0162509 | A1* | 6/2015 | Kuramoto | H10H 20/851 257/98 |
| 2015/0221835 | A1* | 8/2015 | Tischler | H10H 20/857 438/27 |
| 2017/0269749 | A1* | 9/2017 | Bok | H10K 59/122 |
| 2019/0312091 | A1* | 10/2019 | Saida | H10K 50/00 |
| 2020/0343416 | A1* | 10/2020 | Tamma | H01L 21/322 |

* cited by examiner

*Primary Examiner* — Feifei Yeung Lopez
(74) *Attorney, Agent, or Firm* — Banner & Witcoff, Ltd.

(57) ABSTRACT

Methods and systems for improving the efficiency of an LED or micro-LED arrangement are described. In the disclosed embodiments, the LED or micro-LED is surrounded by an angled metasurface mirror, comprised of nanoparticles. This metasurface mirror reflect side emissions from the LED or micro-LED towards an observer, reducing light loss and thereby improving the energy efficiency of, as well as quality of light from, the LED or micro-LED. Other embodiments are described.

23 Claims, 6 Drawing Sheets

NON-TRANSITORY COMPUTER-READABLE STORAGE MEDIUM
1602

PROGRAMMING INSTRUCTIONS 1604,
CONFIGURED TO CAUSE A DEVICE, IN RESPONSE TO EXECUTION
OF THE PROGRAMMING INSTRUCTIONS, TO PRACTICE (ASPECTS
OF) EMBODIMENTS OF THE PROCESS(ES) DESCRIBED
THROUGHOUT THIS DISCLOSURE.

FIG. 6

LOW LOSS DIELECTRIC METASURFACE SIDE MIRRORS FOR MICRO-LEDs

TECHNICAL FIELD

Disclosed embodiments are directed to techniques for improving the efficiency of micro LED-based displays, and in particular to decreasing side loss of light from a micro-LED structure using a mirror.

BACKGROUND

Electronic display panels, such as may be found in a computer monitor or flat-panel television, may be implemented using a number of different technologies. Some such technologies include plasma, liquid-crystal display (LCD), light-emitting diode (LED), organic light-emitting diode (OLED), and laser projection, to name just a few. Panels utilizing LED technologies are increasingly popular, as LEDs offer a reliable, cool, and energy-efficient means of producing light. Until recently, the use of LEDs has been limited to backlights. However, as micro LEDs become available in sizes that are sufficiently small to act as individual pixels, displays may utilize such micro LEDs to directly produce an image, rather than as a backlight for a filter, providing a number of advantages over existing LCD panels (even when such panels are LED backlit), such as improved viewing angles, contrast, latency, and color saturation. For example, white micro LEDs can be used to create a monochrome display panel. Increasingly, micro LEDs are available in pixel sizes that can produce light in the specific wavelengths needed to reproduce a color picture, e.g. red, green, and blue, allowing a flat panel color display to be created directly from the micro LEDs, with red, green, and blue micro LEDs forming sub-pixels for each display pixel. In addition to display technologies, micro LEDs may have other uses, such as chip-to-chip or intra-chip optical interconnection. The microscopic size of the LEDs allows such structures to be closely integrated into microchip packaging.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 is a block diagram of a computer-readable storage medium that can be used to implement some of the components of the methods disclosed herein, according to various embodiments.

DETAILED DESCRIPTION

Micro-light emitting diodes (micro-LEDs), as is common among most types of LEDs, emit light from their semiconductor structure in all directions during operation. While this is acceptable or even preferable in some applications, such as where an omnidirectional light is needed, in applications such as a display panel, light is preferably directed only in a single direction. For example, in a display panel comprised of an array of micro-LEDs, each of the micro-LEDs produces at least a portion of their light directed towards a viewer of the display panel. However, each micro-LED also generates a portion of light that exits through the sides of the micro-LED structure.

Figure 1:
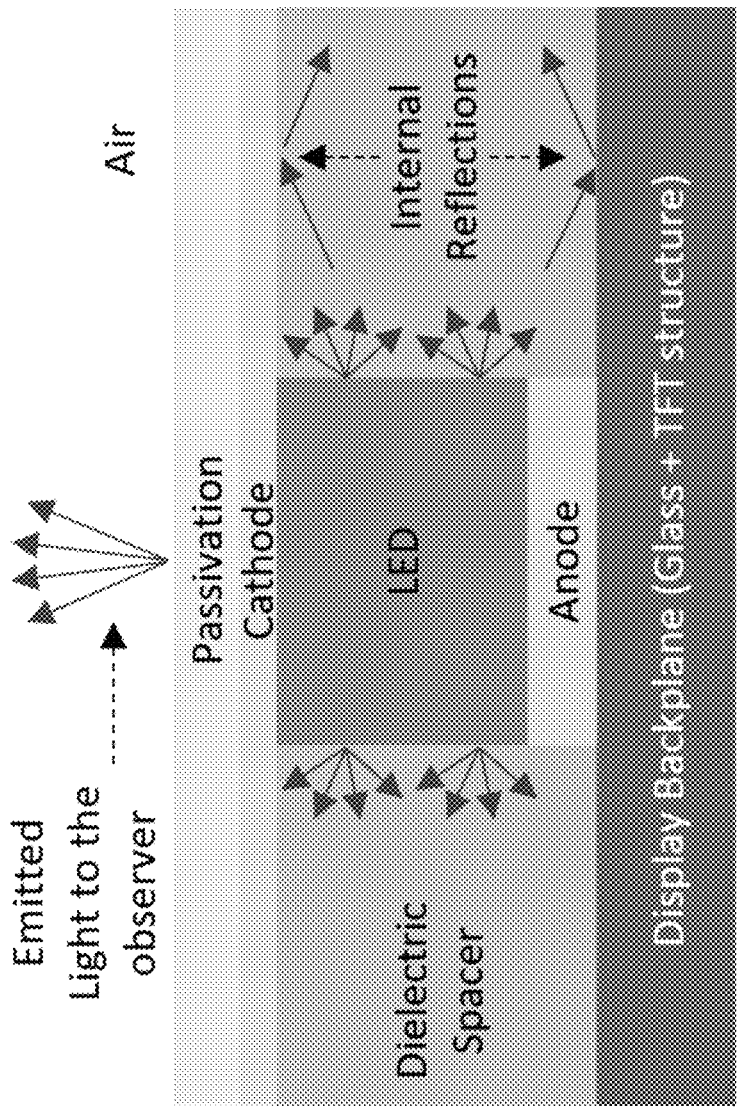
FIG. 1 depicts the arrangement of layers for a micro-LED structure illustrating side loss of light, as known in the prior art.

This phenomenon is illustrated in FIG. 1, which depicts a micro-LED structure that may be found in a display panel. As can be seen, a portion of light is emitted to the observer, who would be viewing the micro-LED from above the passivation layer. The arrows directed from the passivation layer indicate light traveling in the direction of the observer. However, also depicted is light emitted from the sides of the micro-LED structure, indicated by arrows directed laterally within the dielectric spacer layer. This light essentially remains trapped within the dielectric layer, which is often optically transparent or translucent and so can conduct light. The inside surfaces of the dielectric layer may act as mirrors, effectively turning the dielectric layer into an optical wave guide. This side-emitted light is either absorbed or may be eventually emitted towards the user, forming a blur or halo around the micro-LED structure.

Furthermore, where the panel is a color panel, each micro-LED may be configured to emit a different wavelength of light, such as the red, green, and blue colors typically generated in a color display. As is known, each pixel of a color display is comprised of red, green, and blue sub-pixels, such that each micro-LED is surrounded by other micro-LEDs that emit different wavelengths. Depending on the spacing of the sub-pixels, the side emitted light may travel sufficiently far within the dielectric layer to cause undesirable color mixing with other sub-pixels of different wavelengths, and so diminish color saturation and fidelity of the display panel.

Each micro-LED (or LED) consumes power in the generation of light, as the LED effectively converts electrical power into light with relative efficiency. The amount of light emitted by an LED or micro-LED is generally proportional to the amount of power consumed by the LED or micro-LED. In other words, all things being equal, the brighter the LED, the more power it generally consumes. Therefore, light that is not directed in a useful direction but simply absorbed is essentially wasted power. In the context of a display panel, the light emitted from the sides of each micro-LED into the dielectric layer either does not reach the observer or does not reach the observer in a desirable or useful fashion, and so is wasted power. To improve the efficiency of an LED, and in particular the efficiency of a micro-LED based panel, minimizing the loss of side-emitted light in favor of light directed towards the observer is desirable. Such minimization can result in a more efficient micro-LED panel that uses less power to produce an amount of light comparable to a panel with significant losses to side-emitted light.

Known solutions can address the color mixing problem of sub-pixels by creating a barrier between each sub-pixel that absorbs stray light emitted from the sides of each sub-pixel. While this solution can optimize color saturation and gamut, it still does not improve on energy losses from side-emitted light. The barriers absorb light, at best not improving efficiency, and at worst actually decreasing efficiency. As the side-emitted light is absorbed, it not only is not seen by the observer, but also may reduce the incidental light emitted from the sides that eventually finds its way to the observer. While this incidental light could cause undesirable color mixing as discussed above, to the extent it eventually escaped towards the observer, it nevertheless marginally improved efficiency, albeit at the expense of image quality.

Furthermore, most LEDs generate some amount of heat as a byproduct of generating light, with the amount of heat increasing with the intensity of the LED. Light-absorbing barriers typically work by converting visible light into invisible heat. In a display equipped with absorbing barriers, this may result in an undesirable increase in overall panel temperature. The micro-LEDs or LEDs (such as OLEDs) may not only need to be run at a greater intensity to compensate for the loss of brightness to the light absorbing barriers, increasing their temperature, but the absorbing of light by the barriers may further increase panel temperature. As a result, such known displays may improve color fidelity and saturation, but at the expense of potentially greater energy usage and decreased longevity due to thermal effects.

Disclosed embodiments address these shortcomings by surrounding each micro-LED in a display panel with a metasurface side mirror, comprised of nanoparticle metal. The metasurface side mirrors are angled to reflect light emitted from the side of a micro-LED out of the dielectric layer and towards the observer. Thus, a significantly greater amount of the light generated by each micro-LED reaches the observer for a given amount of input power. Furthermore, the metasurface mirrors act as barriers between sub-pixels to prevent undesirable mixing of colors. Accordingly, embodiments can provide a display panel comprised of micro-LEDs that achieves desirable or improved color fidelity and saturation, but with lower operating temperatures, lower light loss, and improved power efficiency. Other embodiments may be described herein.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 2:
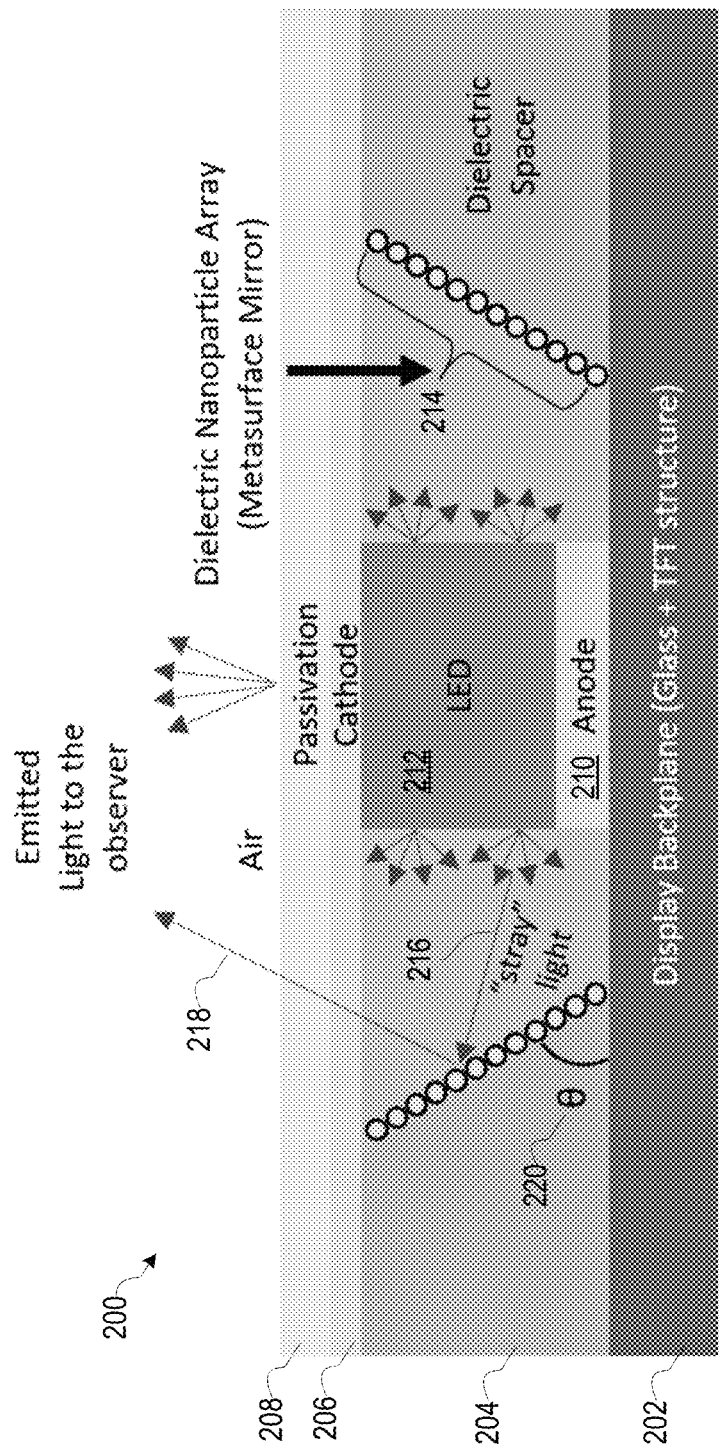
FIG. 2 depicts an example arrangement of layers for a micro-LED that includes a metasurface side mirror for capturing and redirecting light emitted from the sides of the micro-LED, according to various embodiments.

FIG. 2 illustrates an example arrangement 200 of layers on a substrate 202 for a semiconductor structure such as a micro-light emitting diode (micro-LED) 212, according to some embodiments. Arrangement 200, as depicted in FIG. 2, includes substrate 202, a dielectric layer 204, a cathode 206, a passivation layer 208, and a mirror 214. It will be understood that arrangement 200 illustrates one structure. In embodiments the structure illustrated in arrangement 200 is repeated numerous times, such as in a display panel that utilizes thousands, or even millions, of micro-LEDs.

Substrate 202, in embodiments, may comprise a backplane and a thin-film transistor (TFT) structure. The backplane may be fabricated from glass, plastic, or another material suitable for the intended use of arrangement 200 in a given embodiment. For example, where arrangement 200 is part of a display panel, substrate 202 may comprise a glass backplane. Where arrangement 200 is part of a flexible display panel, substrate 202 may comprise either a glass backplane (if sufficiently thin), or a flexible plastic substrate. The substrate 202 may also include a TFT structure comprising driver electronics for supplying power to and controlling the micro-LED 212. The TFT structure may accordingly be fabricated from a suitable substrate material such as Silicon, which may be doped and etched to create the TFT structure, as is known in the art. It should be appreciated that the position of "top" or "topmost" in reference to other layers is made with reference to the substrate 202 as the "bottom" layer or reference plane, and should not be understood as suggesting any particular orientation of the wafer during processing.

A dielectric layer 204 is formed on the substrate 202. Dielectric layer 204 serves as a spacer between the substrate 202 and its TFT structure, and the micro-LED 212, and acts as a structural support by encasing the sides of the micro-LED 212. In the depicted embodiment, dielectric layer 204 does not cover the micro-LED 212, as can be seen, but rather may be substantially flush with it. In other embodiments, dielectric layer 204 may not be flush with the surface of micro-LED 212, so long as micro-LED 212 is at least partially exposed, and not fully covered, by dielectric layer 204. Dielectric layer 204 may be formed from an oxide (eg. SiO2) and/or nitride (eg. Si3N4), and may be formed in two or more operations, as will be discussed below with respect to FIGS. 3 and 4. Dielectric layer 204, in embodiments, is optically transparent or translucent, and so is capable of passing light that may be emitted from the sides of micro-LED 212, which are adjacent to and within dielectric layer 204. Dielectric layer 204 may be formed using any process, known or later developed, suitable for forming a semiconductor layer.

A cathode layer 206 is formed on the dielectric layer 204 and micro-LED 212, such that the cathode layer 206 is in electrical contact with micro-LED 212, in embodiments. Cathode layer 206 acts to conduct current with micro-LED 212, so that an electrical circuit can be completed with micro-LED 212, allowing micro-LED 212 to be powered and emit light. Cathode layer 206 is accordingly electrically conductive to a level suitable to allow micro-LED 212 to function. Cathode layer 206 may be fabricated from a suitable optically transparent or translucent material that is also electrically conductive. Some example materials may include a metal oxide, such as Nickel oxide, or a properly doped silicon layer. The cathode layer 206 may be formed using any suitable process now known or later developed.

A passivation layer 208 is then formed on the cathode layer 206. The passivation layer 208 is, in embodiments, a dielectric material that is used to insulate the cathode layer 206 and protect the structure of arrangement 200. Passivation layer 208 may be fabricated from a similar material as the dielectric layer 204, such as an oxide or a nitride, or another suitable non-conductive and optically transparent or translucent material that provides sufficient protection for arrangement 200. It will be understood that the optical transmission characteristics of cathode layer 206 and passivation layer 208 may be selected to minimize any loss of light emitted from the micro-LED 212.

Between substrate 202 and micro-LED 212, anode 210 is formed, in embodiments. Anode 210, in conjunction with cathode layer 206, provides an electrical connection to power the micro-LED 212. Anode 210 connects micro-LED 212 to the TFT driver circuitry located in substrate 202, which controls power delivery to the micro-LED 212 and allows it to be selectively illuminated and/or the illumination intensity to be controlled. Anode 210 may be fabricated using any suitable material, such as a metal pad or other conductive material, and may be formed using any suitable process now known or later developed.

Micro-LED 212 is formed on top of the anode 210, in embodiments, and may be fabricated using any suitable technique for creating a micro-LED now known or later developed. In other embodiments, micro-LED 212 may instead be a more traditional or normal-scale LED, or another suitable light-emitting semiconductor structure. In embodiments, micro-LED 212 is at least partially formed from Gallium nitride. The particular materials used to implement micro-LED 212 may vary depending upon the desired wavelength of light to be output by the micro-LED 212. In embodiments where each micro-LED is a sub-pixel of a color display panel, each micro-LED may have a different composition to create different light wavelengths, to form the plurality of pixels of a color display panel. Although FIG. 2 illustrates micro-LED 212 as a column, micro-LED 212 may be shaped differently depending upon the implementation of a given embodiment. For example, in some embodiments, micro-LED 212 may be a pyramidal structure, or have a stem, or be implemented in another shape. The shape of micro-LED 212 may impact on the direction of light emitted from its sides. In the depicted embodiment where a micro-LED 212 is being fabricated, the micro-LED structure, here a GaN epitaxial nanopyramid, is grown to a height of ~600 nm for blue LEDs and ~400 nm for green LEDs.

As can be seen in FIG. 2, each micro-LED 212 has side emissions 216 or "stray light" that are transmitted into the dielectric layer 204. This light would normally propagate through the dielectric layer 204, rather than be emitted towards an observer. To redirect such side emissions 216, a metasurface mirror 214 is formed within the dielectric layer 204. The metasurface mirror 214, in embodiments, is formed from a nanoparticle array of dielectric particles, or another suitably reflective material, rather than a typical metallic mirror, which may be formed via vapor-deposition. The nanoparticle array of dielectric particles gives the metasurface mirror improved properties over a metal film mirror. A metal film mirror may be relatively inefficient due to Ohmic loss. In comparison, the metasurface mirror 214 utilizes Rayleigh scattering or Mie scattering which can be tuned to a specific wavelength, such as the desired wavelength emitted by micro-LED 212, and can achieve a reflection coefficient that approaches 100%. The scattering effect is likewise improved over a mirror, as the scattering effect provides a relatively diffuse reflection that provides smoother and more even light output than may be obtained from a conventional mirror. As a result, the picture quality of a display panel implementing an embodiment of arrangement 200 can be improved over the picture quality of a display panel implementing a mirror.

The nanoparticles may comprise dielectric materials such as Zinc oxide, Titanium oxide, Silicon oxide, a suitable polymer material, or another suitable dielectric material now known or later developed. In other embodiments, the nanoparticles may comprise a suitable metal, depending upon the needs of a given implementation. In keeping with the principles of Rayleigh and Mie scattering, in embodiments the nanoparticles of the metasurface mirror 214 may be smaller than the target light wavelength. The target light wavelength is, in embodiments, the wavelength emitted by the micro-LED 212 with which the metasurface mirror 214 is employed. In some embodiments, the nanoparticles may be approximately $1/10^{th}$ of the target light wavelength, which for micro-LEDs that emit red to orange light may be around 60 to 70 nanometers in size, corresponding to light wavelengths of approximately 600 to 700 nm. Other micro-LEDs that emit shorter wavelengths, e.g. green around 550 nm, and blue around 450 nm, may use correspondingly smaller sized nanoparticles. However, some embodiments may deviate from these size relationships, depending upon the needs of a specific implementation.

Referring back to FIG. 2, the side emissions 216 interact with the metasurface mirror 214 and are deflected or reflect 218 approximately orthogonally, out of the dielectric layer 204 and towards the observer. The angle of deflection is at least partially determined by an angle theta 220. In embodiments, theta 220 is approximately 45 degrees. In other embodiments, this angle theta 220 may vary greater or less than 45 degrees, e.g. 40-50 degrees, 30-60 degrees, 20-70 degrees, etc., depending upon the needs of a given implementation. The theta 220 may, in embodiments, allow for the recovery of stray light and quality of reflected/scattered light by the metasurface mirror 214 to be adjusted. Furthermore, as mentioned above, the direction of side emissions 216 may depend on the shape/geometry of micro-LED 212. Thus, theta 220 may further be adjusted depending on the shape of micro-LED 212, with a particular shape having a specific angle or range of angles for theta 220 that achieves optimal efficiency from recovering the side emissions 216. In the embodiment of a roughly rectangular or pyramidal LED, a theta 220 of 45 degrees may be employed.

As mentioned variously above, the various layers of arrangement 200 may be grown using any suitable process that is appropriate for the nature of the semiconductor structure, typically providing for epitaxial growth. For example, vapor-phase, liquid-phase, or solid-phase epitaxy processes may be selected depending upon the nature of the semiconductor being fabricated and the size and type of substrate 202. In other examples, molecular beam epitaxy may be utilized, depending upon the size of the substrate 202. The selection of the epitaxy process may further depend upon costs, yields, and the nature of the final product in which the semiconductors are to be used. Still other types of processes may be employed, depending upon the intended application.

FIGS. 3A-3D illustrate a possible progression of formation of the layers of an embodiment of arrangement 200. In the layer arrangement of FIG. 3A, a first dielectric layer part 302 is formed on top of substrate 202. As discussed above with respect to arrangement 200, substrate 202 may have been preformed with a TFT layer or structure that comprises driver circuitry for the micro-LEDs. First dielectric layer part 302 includes an opening 304 through which the substrate 202 is exposed. Anode 210, described above, may be formed approximately in the center of this opening 304. Depending on how a manufacturing process is implemented, anode 210 may be first deposited, then first dielectric layer part 302 subsequently formed, or first dielectric layer part 302 may be formed prior to anode 210.

First dielectric layer part 302 is formed with an angled sidewall 306. The angle of sidewall 306 defines the angle theta 220 (FIG. 2), which determines the angle of the metasurface mirror 214 (FIG. 2) that will be subsequently formed. This angled sidewall 306 may be formed using a grayscale or gradient mask and subsequent etching process, or another suitable method now known or later developed that achieves the intended angle theta 220 for angled sidewall 306.

Figure 3A:
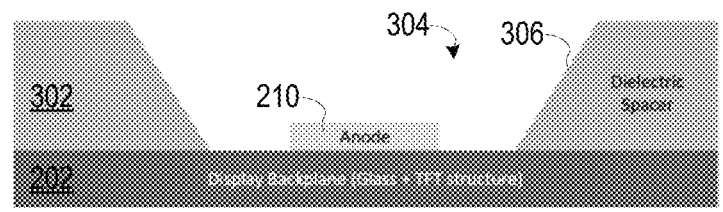
FIG. 3A depicts an initial arrangement of layers for creating the arrangement of layers of FIG. 2, with an anode and a dielectric with a well being formed on a substrate, according to various embodiments.
Figure 3B:
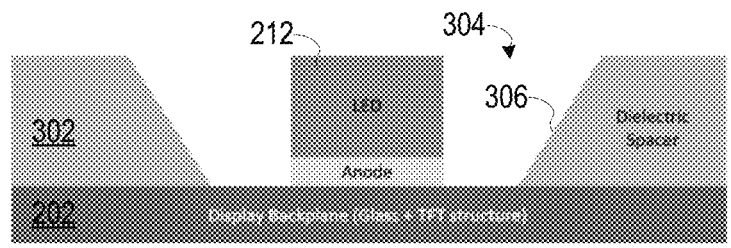
FIG. 3B depicts the arrangement of layers of FIG. 3A following formation of the micro-LED structure upon the anode, according to various embodiments.

In the layer arrangement of FIG. 3B, the micro-LED 212 is formed within opening 304 on the anode 210. Micro-LED 212, in embodiments, may be directly formed upon anode 210 after the first dielectric layer part 302 is formed, or may be formed following formation of anode 210, but prior to formation of first dielectric layer part 302. In some embodiments, micro-LED 212 may be formed on a separate wafer and then transferred to anode 210, depending upon the manufacturing process employed.

Figure 3C:
FIG. 3C depicts the arrangement of layers of FIG. 3B with a nanoparticle metasurface mirror formed on the sides of the well, and the dielectric layer formed in the well over the mirror and encapsulating the micro-LED structure, according to various embodiments.

In the layer arrangement of FIG. 3C, metasurface mirror 214 is formed on the angled sidewall 306 by deposition of the constituent nanoparticles. Formation of the metasurface mirror 214 may be accomplished by any suitable technique now known or later developed. Following deposition of the metasurface mirror 214, a second dielectric layer part 308 is deposited to fill opening 304, surrounding and encasing the sides of micro-LED 212 and metasurface mirror 214. Second dielectric layer part 308 may be of the same material as first dielectric layer part 303, or of a different material that may be selected to enhance the function of the metasurface mirror 214 and recovery of side emissions from the micro-LED 212. As can be seen in FIG. 3C, first dielectric layer part 302 and second dielectric layer part 308 rise to approximately the same height above substrate 202, and are roughly flush with the top of micro-LED 212. However, the layers need not be flush, so long as a sufficient amount of micro-LED 212 is exposed to contact cathode layer 206.

Figure 3D:
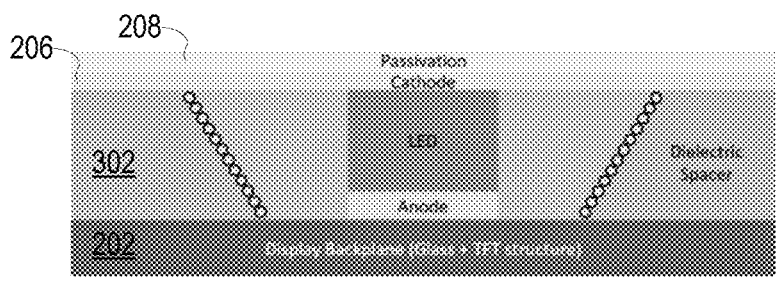
FIG. 3D depicts the arrangement of layers of FIG. 3C with a cathode and passivation layer formed over the dielectric layer and micro-LED structure, according to various embodiments.

In the layer arrangement of FIG. 3D, the cathode layer 206 is next formed on the dielectric layer and micro-LED 212, completing the circuit with the micro-LED 212, which is sandwiched between anode 210 and cathode layer 206. Passivation layer 208 is next formed atop cathode layer 206, to complete the arrangement.

Figure 4:
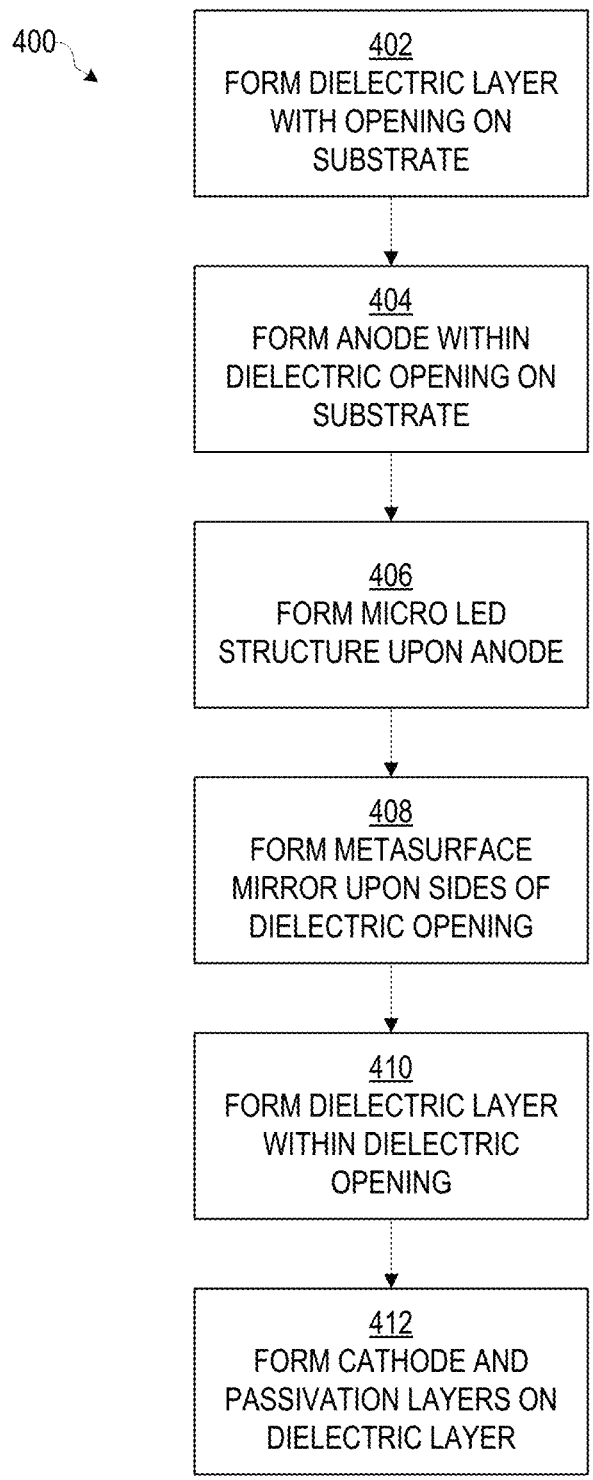
FIG. 4 is a flowchart of the operations of an example method for creating a micro-LED that includes a metasurface side mirror, according to various embodiments.

FIG. 4 is a flowchart of the operation of an example method 400 for creating a semiconductor arrangement, such as arrangement 200, according to a possible embodiment. The operations of method 400 may be carried out in whole or in part, and in order or out of order as the operations may permit. Additional operations may be added in some embodiments, and some operation may be omitted in some embodiments. Method 400 illustrates an example embodiment of the layer formation described above with respect to FIGS. 3A-3D. For specifics of some of these operations, the reader is referred to the description above in connection with FIGS. 2 and 3A-3D.

In operation 402, a dielectric layer, such as first dielectric layer part 302, is formed on a substrate, such as substrate 202, but with an opening that has an angled side.

In operation 404, an anode is next formed on the substrate, within the opening in the dielectric layer. The anode may be positioned to connect with driver circuitry or TFT structures in the substrate 202, so that the anode can transfer power from or to the driver circuitry.

In operation 406, a micro-LED structure, such as micro-LED 212, is formed or transferred onto the anode. In embodiments, the opening within the dielectric layer is sufficiently large so that the micro-LED 212 does not contact the angled wall.

In operation 408, the metasurface mirror, such as metasurface mirror 214, is formed on the angled sidewall of the dielectric layer. The metasurface mirror 214 may be formed from an array of dielectric nanoparticles. As discussed above, these nanoparticles may be selected in size and composition to optimize reflection of side emissions from the micro-LED towards an observer.

In operation 410, a dielectric layer is formed within the opening, to encapsulate and support the sides of the micro-LED and metasurface mirror. This dielectric fill layer may be of the same or a different composition as the dielectric layer formed in operation 402. The top or a portion of the top of the micro-LED is left exposed.

Finally, in operation 412, the cathode and passivation layers are formed upon the completed dielectric layer and micro-LED. The cathode layer contacts the exposed top or portion of the micro-LED, to complete the circuit with the micro-LED, anode, and driver circuitry in the substrate.

Once the arrangement is formed, it may be further processed into its intended use form, such as a display panel, optical interconnect, light source, or another intended implementation.

Method 400 may be carried out by an automated process or system, which may be performed by one or more computer devices 1500, discussed below with respect to FIG. 5, that may be running computer readable software, discussed below with respect to FIG. 6. Furthermore, it should be understood that while the foregoing discusses a semiconductor structure in singular, the foregoing processes may be used on a wafer in the simultaneous fabrication of multiple semiconductors, depending upon the particulars of a given implementation.

Figure 5:
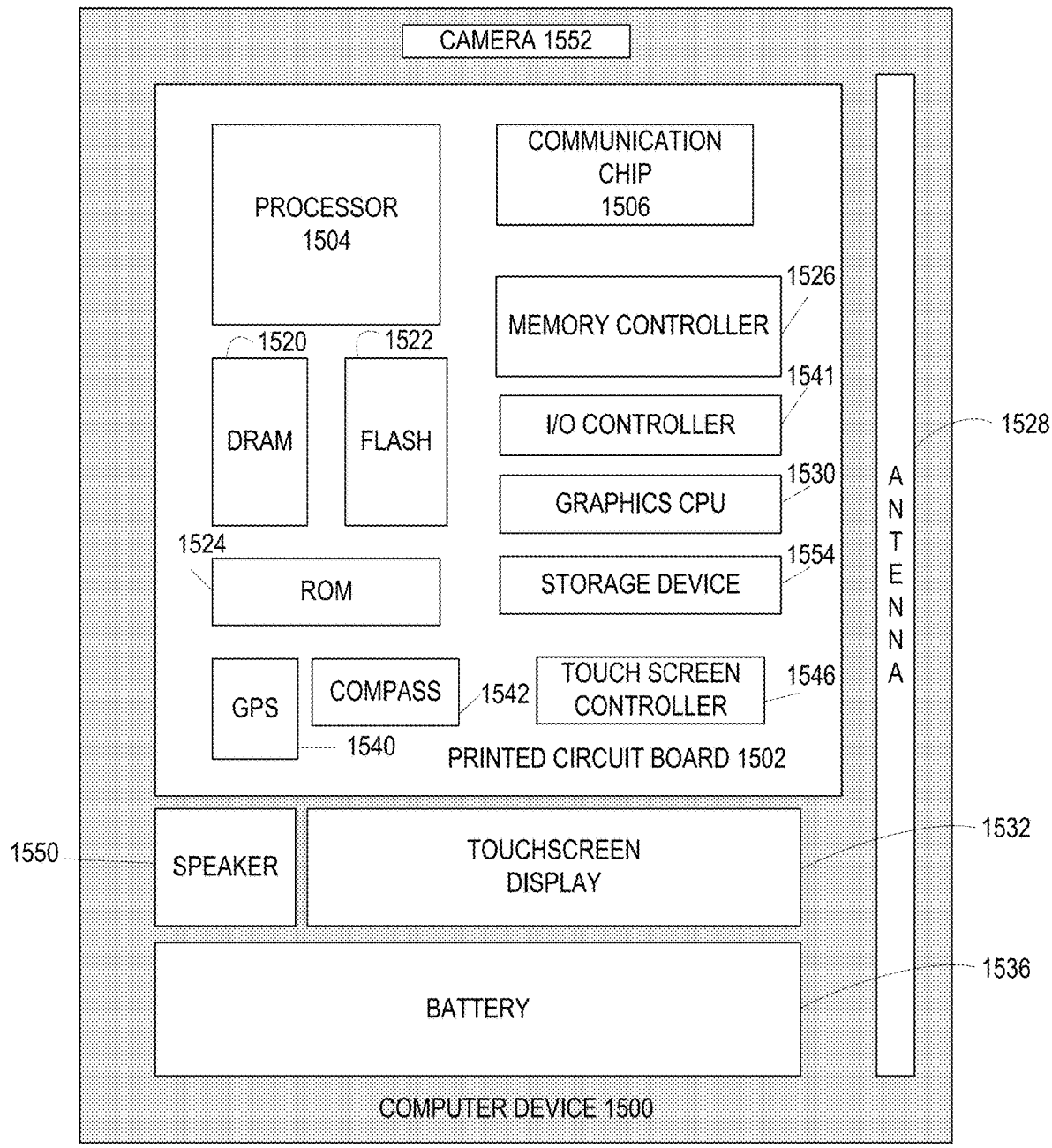
FIG. 5 is a block diagram of an example computer that can be used to implement some or all of the components of a system that may be used in fabricating a micro-LED or performing some of the operations of the example method of FIG. 4, according to various embodiments.

FIG. 5 illustrates an example computer device 1500 that may be employed by the apparatuses and/or methods described herein, in accordance with various embodiments. As shown, computer device 1500 may include a number of components, such as one or more processor(s) 1504 (one shown) and at least one communication chip 1506. In various embodiments, one or more processor(s) 1504 each may include one or more processor cores. In various embodiments, the one or more processor(s) 1504 may include hardware accelerators to complement the one or more processor cores. In various embodiments, the at least one communication chip 1506 may be physically and electrically coupled to the one or more processor(s) 1504. In further implementations, the communication chip 1506 may be part of the one or more processor(s) 1504. In various embodiments, computer device 1500 may include printed circuit board (PCB) 1502. For these embodiments, the one or more processor(s) 1504 and communication chip 1506 may be disposed thereon. In alternate embodiments, the various components may be coupled without the employment of PCB 1502.

Depending on its applications, computer device 1500 may include other components that may be physically and electrically coupled to the PCB 1502. These other components may include, but are not limited to, memory controller 1526, volatile memory (e.g., dynamic random access memory (DRAM) 1520), non-volatile memory such as read only memory (ROM) 1524, flash memory 1522, storage device 1554 (e.g., a hard-disk drive (HDD)), an I/O controller 1541, a digital signal processor (not shown), a crypto processor (not shown), a graphics processor 1530, one or more antennae 1528, a display, a touch screen display 1532, a touch screen controller 1546, a battery 1536, an audio codec (not shown), a video codec (not shown), a global positioning system (GPS) device 1540, a compass 1542, an accelerometer (not shown), a gyroscope (not shown), a speaker 1550, a camera 1552, and a mass storage device (such as hard disk drive, a solid state drive, compact disk (CD), digital versatile disk (DVD)) (not shown), and so forth.

In some embodiments, the one or more processor(s) 1504, flash memory 1522, and/or storage device 1554 may include associated firmware (not shown) storing programming instructions configured to enable computer device 1500, in response to execution of the programming instructions by one or more processor(s) 1504, to practice all or selected aspects of the method 400 or the various process flows described herein. In various embodiments, these aspects may additionally or alternatively be implemented using hardware separate from the one or more processor(s) 1504, flash memory 1522, or storage device 1554.

The communication chips 1506 may enable wired and/or wireless communications for the transfer of data to and from the computer device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1500 may include a plurality of communication chips 1506. For instance, a first communication chip 1506 may be dedicated to shorter range wireless communications such as Wi-Fi and Bluetooth, and a second communication chip 1506 may be dedicated to longer range wireless communications such as GPS, EDGE, GPRS, CDMA, WiMAX, LTE, Ev-DO, and others.

In various implementations, the computer device 1500 may be a laptop, a netbook, a notebook, an ultrabook, a smartphone, a computer tablet, a personal digital assistant (PDA), a desktop computer, smart glasses, or a server. In further implementations, the computer device 1500 may be any other electronic device that processes data.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium. FIG. 6 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 1602 may include a number of programming instructions 1604. Programming instructions 1604 may be configured to enable a device, e.g., computer 1500, in response to execution of the programming instructions, to implement (aspects of) the method 400 or the various process flows described above. In alternate embodiments, programming instructions 1604 may be disposed on multiple computer-readable non-transitory storage media 1602 instead. In still other embodiments, programming instructions 1604 may be disposed on computer-readable transitory storage media 1602, such as, signals.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

EXAMPLES

The following examples pertain to further embodiments:

Example 1 is an apparatus, comprising a substrate; a micro-light emitting diode (micro-LED) formed on the substrate; a dielectric layer formed on the substrate that surrounds the micro-LED; and a metasurface mirror formed within the dielectric layer that is spaced from and surrounds the micro-LED, wherein the metasurface mirror is angled with respect to the micro-LED to reflect light from the micro-LED that is emitted from the micro-LED into the dielectric layer out of the dielectric layer and in a direction away from the substrate.

Example 2 includes the subject matter of example 1, or some other example herein, further comprising an anode formed on the substrate, and wherein the micro-LED is formed on the anode.

Example 3 includes the subject matter of example 1 or 2, or some other example herein, further comprising a cathode formed on the dielectric layer and micro-LED.

Example 4 includes the subject matter of example 3, or some other example herein, further comprising a passivation layer formed on the cathode.

Example 5 includes the subject matter of any of examples 1-4, or some other example herein, wherein the metasurface mirror is comprised of a nanoparticle array.

Example 6 includes the subject matter of example 5, or some other example herein, wherein the nanoparticle array of the metasurface mirror is comprised of a dielectric material.

Example 7 includes the subject matter of any of example 1-6, or some other example herein, wherein the dielectric material of the metasurface mirror is comprised of one or more of Zinc, Titanium, Silicon, or Oxygen.

Example 8 includes the subject matter of any of example 1-7, or some other example herein, wherein the substrate is comprised of a glass layer and a thin-film transistor layer to drive the micro-LED.

Example 9 includes the subject matter of any of examples 1-8, or some other example herein, wherein the mirror is angled between 30 to 50 degrees with respect to the substrate.

Example 10 is a method, comprising forming, upon a substrate, a micro-LED; forming, upon the substrate, a dielectric layer surrounding the micro-LED; and forming, within the dielectric layer, a metasurface mirror spaced from and surrounding the micro-LED; wherein the metasurface mirror is formed angled with respect to the micro-LED to reflect light from the micro-LED that is emitted from the micro-LED into the dielectric layer out of the dielectric layer and in a direction away from the substrate.

Example 11 includes the subject matter of example 10, or some other example herein, wherein forming the dielectric layer and mirror comprises forming, on the substrate, a first dielectric layer part, the first dielectric layer part formed with an opening that exposes the substrate and an angled sidewall; forming, on the sidewall of the opening, the metasurface mirror; and forming, on the metasurface mirror, a second dielectric layer part, the second dielectric part filling the opening.

Example 12 includes the subject matter of example 11, or some other example herein, wherein forming the metasurface mirror further comprises depositing, on the side of the opening, a nanoparticle array.

Example 13 includes the subject matter of example 11 or 12, or some other example herein, wherein forming the first dielectric layer part comprises forming the wall of the first dielectric layer part at an angle that is selected with respect to the wavelength emitted by the micro-LED.

Example 14 includes the subject matter of any of examples 11-13, or some other example herein, wherein forming the first dielectric layer part comprises forming the first dielectric layer part using a gray-scale photoresist mask and etching.

Example 15 includes the subject matter of any of examples 10-14, or some other example herein, further comprising forming, on the dielectric layer and micro-LED, a cathode, and forming, on the cathode, a passivation layer.

Example 16 includes the subject matter of any of examples 10-15, or some other example herein, wherein forming the micro-LED comprises forming, on the substrate, an anode, and forming, on the anode, the micro-LED.

Example 17 is a system, comprising a plurality of micro-light emitting diodes (micro-LEDs) formed upon a substrate; a dielectric layer disposed upon a substrate surrounding the plurality of micro-LEDs; and a plurality of metasurface mirrors, individuals of the plurality of metasurface mirrors spaced apart from corresponding individuals of the plurality of micro-LEDs, the plurality of metasurface mirrors formed within the dielectric layer, wherein the plurality of metasurface mirrors are angled so that light emitted from sides of the corresponding plurality of micro-LEDs is directed away from the substrate.

Example 18 includes the subject matter of example 17, or some other example herein, wherein the plurality of metasurface mirrors are formed as nanoparticle arrays.

Example 19 includes the subject matter of example 18, or some other example herein, wherein the nanoparticle arrays comprise particles of a dielectric material.

Example 20 includes the subject matter of example 19, or some other example herein, wherein the dielectric material of the nanoparticle arrays are comprised of one or more of Zinc, Titanium, Silicon, or Oxygen.

Example 21 includes the subject matter of any of examples 17-20, or some other example herein, wherein individuals of the plurality of metasurface mirrors are angled at an angle selected with respect to the corresponding individuals of the plurality of micro-LEDs.

Example 22 includes the subject matter of any of examples 17-21, or some other example herein, wherein the system is a display.

Example 23 includes the subject matter of example 22, or some other example herein, wherein the display is part of a mobile device.

What is claimed is:

1. An apparatus, comprising:
   a substrate;
   a micro-light emitting diode (micro-LED) formed on the substrate;
   a dielectric layer formed on the substrate that surrounds the micro-LED; and
   a metasurface mirror formed within the dielectric layer that is spaced from and surrounds the micro-LED, wherein the metasurface mirror is angled with respect to the micro-LED to reflect light from the micro-LED that is emitted from the micro-LED into the dielectric layer out of the dielectric layer and in a direction away from the substrate.

2. The apparatus of claim 1, further comprising an anode formed on the substrate, and wherein the micro-LED is formed on the anode.

3. The apparatus of claim 2, further comprising a cathode formed on the dielectric layer and micro-LED.

4. The apparatus of claim 3, further comprising a passivation layer formed on the cathode.

5. The apparatus of claim 1, wherein the metasurface mirror is comprised of a nanoparticle array.

6. The apparatus of claim 5, wherein the nanoparticle array of the metasurface mirror is comprised of a dielectric material.

7. The apparatus of claim 6, wherein the dielectric material of the metasurface mirror is comprised of one or more of Zinc, Titanium, Silicon, or Oxygen.

8. The apparatus of claim 1, wherein the substrate is comprised of a glass layer and a thin-film transistor layer to drive the micro-LED.

9. The apparatus of claim 1, wherein the mirror is angled between 30 to 50 degrees with respect to the substrate.

10. A method, comprising:
    forming, upon a substrate, a micro-LED;
    forming, upon the substrate, a dielectric layer surrounding the micro-LED; and
    forming, within the dielectric layer, a metasurface mirror spaced from and surrounding the micro-LED;
    wherein the metasurface mirror is formed angled with respect to the micro-LED to reflect light from the micro-LED that is emitted from the micro-LED into the dielectric layer out of the dielectric layer and in a direction away from the substrate.

11. The method of claim 10, wherein forming the dielectric layer and mirror comprises:
    forming, on the substrate, a first dielectric layer part, the first dielectric layer part formed with an opening that exposes the substrate and an angled sidewall;
    forming, on the sidewall of the opening, the metasurface mirror; and
    forming, on the metasurface mirror, a second dielectric layer part, the second dielectric part filling the opening.

12. The method of claim 11, wherein forming the metasurface mirror further comprises depositing, on the side of the opening, a nanoparticle array.

13. The method of claim 11, wherein forming the first dielectric layer part comprises forming the wall of the first dielectric layer part at an angle that is selected with respect to the wavelength emitted by the micro-LED.

14. The method of claim 11, wherein forming the first dielectric layer part comprises forming the first dielectric layer part using a gray-scale photoresist mask and etching.

15. The method of claim 10, further comprising forming, on the dielectric layer and micro-LED, a cathode, and forming, on the cathode, a passivation layer.

16. The method of claim 10, wherein forming the micro-LED comprises forming, on the substrate, an anode, and forming, on the anode, the micro-LED.

17. A system, comprising:
    a plurality of micro-light emitting diodes (micro-LEDs) formed upon a substrate;
    a dielectric layer disposed upon a substrate surrounding the plurality of micro-LEDs; and
    a plurality of metasurface mirrors, individuals of the plurality of metasurface mirrors spaced apart from corresponding individuals of the plurality of micro-LEDs, the plurality of metasurface mirrors formed within the dielectric layer, wherein the plurality of metasurface mirrors are angled so that light emitted from sides of the corresponding plurality of micro-LEDs is directed away from the substrate.

18. The system of claim 17, wherein the plurality of metasurface mirrors are formed as nanoparticle arrays.

19. The system of claim 18, wherein the nanoparticle arrays comprise particles of a dielectric material.

20. The system of claim 19, wherein the dielectric material of the nanoparticle arrays are comprised of one or more of Zinc, Titanium, Silicon, or Oxygen.

21. The system of claim 17, wherein individuals of the plurality of metasurface mirrors are angled at an angle selected with respect to the corresponding individuals of the plurality of micro-LEDs.

22. The system of claim 17, wherein the system is a display.

23. The system of claim 22, wherein the display is part of a mobile device.

* * * * *